US012353815B2

(12) United States Patent
Chang et al.

(10) Patent No.: US 12,353,815 B2
(45) Date of Patent: Jul. 8, 2025

(54) METHOD FOR CHIP INTEGRATION

(71) Applicant: Taiwan Semiconductor Manufacturing Company, Ltd., Hsinchu (TW)

(72) Inventors: Yung Feng Chang, Hsinchu (TW); Yu-Jung Chang, Hsinchu County (TW); Tung-Heng Hsieh, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 613 days.

(21) Appl. No.: 17/828,648

(22) Filed: May 31, 2022

(65) Prior Publication Data

US 2023/0385505 A1 Nov. 30, 2023

(51) Int. Cl.
*G06F 30/392* (2020.01)
(52) U.S. Cl.
CPC .................. *G06F 30/392* (2020.01)
(58) Field of Classification Search
CPC ..................................... G06F 30/392
USPC ......................................... 716/119
See application file for complete search history.

(56) References Cited

U.S. PATENT DOCUMENTS

| 9,213,233 | B2 | 12/2015 | Chang |
| 9,377,680 | B2 | 6/2016 | Chen |
| 9,465,906 | B2 | 10/2016 | Chang |
| 9,946,827 | B2 | 4/2018 | Wang |
| 10,521,538 | B2 | 12/2019 | Chiang |
| 11,256,839 | B1 | 2/2022 | Chickermane et al. |

(Continued)

FOREIGN PATENT DOCUMENTS

| TW | 201520800 A | 6/2015 |
| TW | 201945835 A | 12/2019 |
| TW | 202001638 A | 1/2020 |

(Continued)

OTHER PUBLICATIONS

Yung Feng Chang et al., Method and Structure for Mandrel Patterning, U.S. Appl. No. 17/566,472, filed Dec. 30, 2021, Assignee: Taiwan Semiconductor Manufacturing Company, Ltd., 24 pages specification, 13 pages drawings.

*Primary Examiner* — Eric D Lee
(74) *Attorney, Agent, or Firm* — HAYNES AND BOONE, LLP

(57) ABSTRACT

A method for making an integrated circuit (IC) includes inserting black boxes into a layout of the IC; connecting the black boxes with a connectivity network; and inserting first dummy patterns in areas of the layout outside of the black boxes and the connectivity network. After the inserting of the first dummy patterns, the method further includes replacing the black boxes with circuit macros that have one-to-one correspondence with the black boxes, wherein each of the circuit macros includes circuit patterns in a central area of the respective circuit macro and second dummy patterns surrounding the central area. In the method, at least one of the following operations is performed by an electronic design automation (EDA) tool: the inserting of the black boxes, the connecting of the black boxes, the inserting of the first dummy patterns, and the replacing of the black boxes with the circuit macros.

20 Claims, 8 Drawing Sheets

(56) References Cited

U.S. PATENT DOCUMENTS

2011/0204470 A1* 8/2011 Cheng .................. G06F 30/39
                                                         257/E23.179
2021/0042461 A1* 2/2021 Hu ....................... G06F 30/398

FOREIGN PATENT DOCUMENTS

| TW | 202016645 A | 5/2020 |
| TW | 202038128 A | 10/2020 |
| TW | 202107329 A | 2/2021 |

* cited by examiner

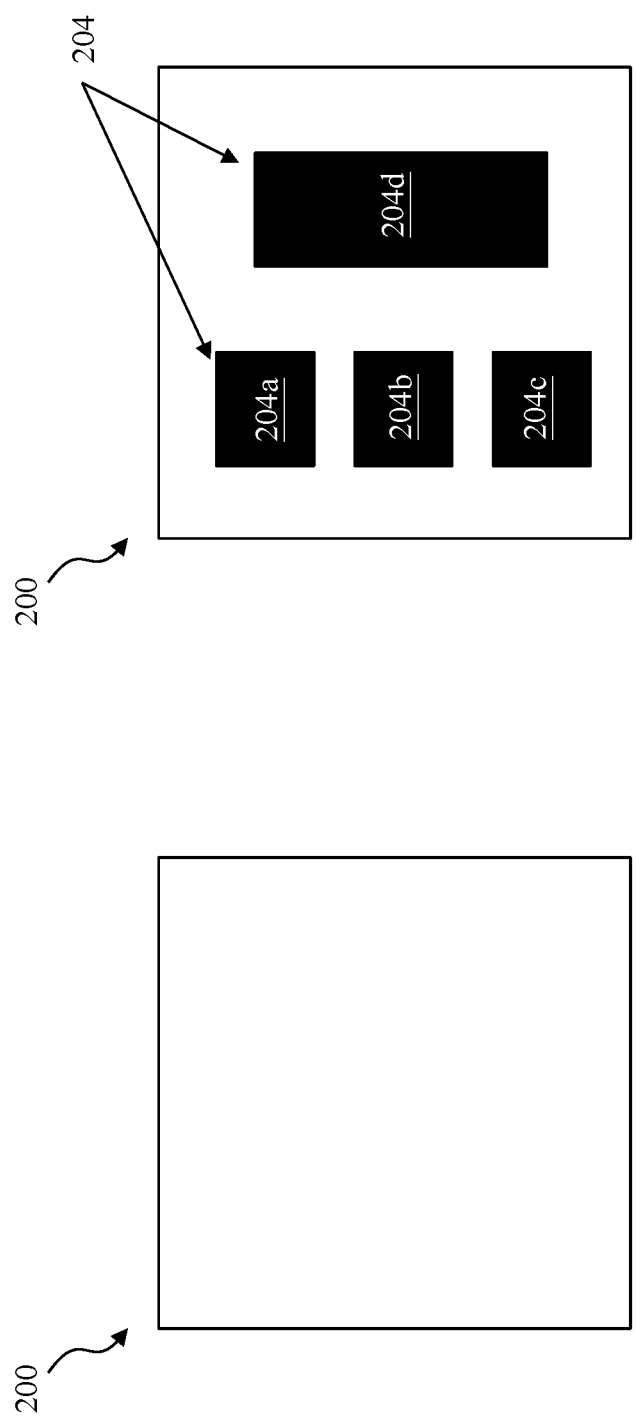

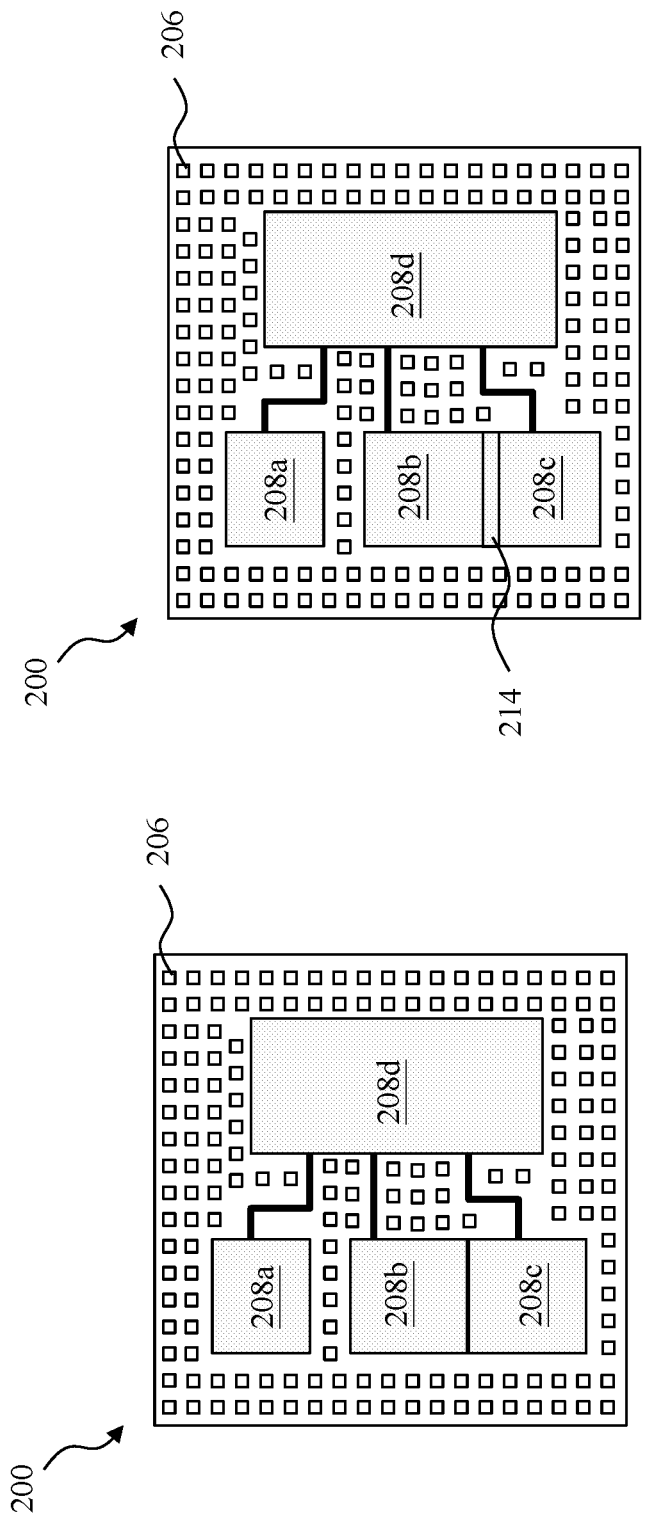

METHOD FOR CHIP INTEGRATION

BACKGROUND

The integrated circuit (IC) evolution involves increased IC design complexity and shortened time-to-market. Designers generally face a demanding project schedule from IC conception to IC production. To meet these challenges, one approach is to integrate multiple circuit macros (sometimes referred to as IP blocks) into an IC where the circuit macros are developed in parallel, thereby saving the overall IC design cycle. However, there are challenges in this approach too. For example, designers may have to wait for the circuit macros to be fully developed, which may take quite some time.

Accordingly, design methods for ICs utilizing circuit macros need further improvements.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, and 6 illustrate diagrammatic views of an IC layout during the IC physical design phase shown in FIG. 1 according to various aspects of the present disclosure.

FIGS. 11 and 12 each illustrate a diagrammatic view of an IC layout according to various aspects of the present disclosure.

DETAILED DESCRIPTION

Figure 1:
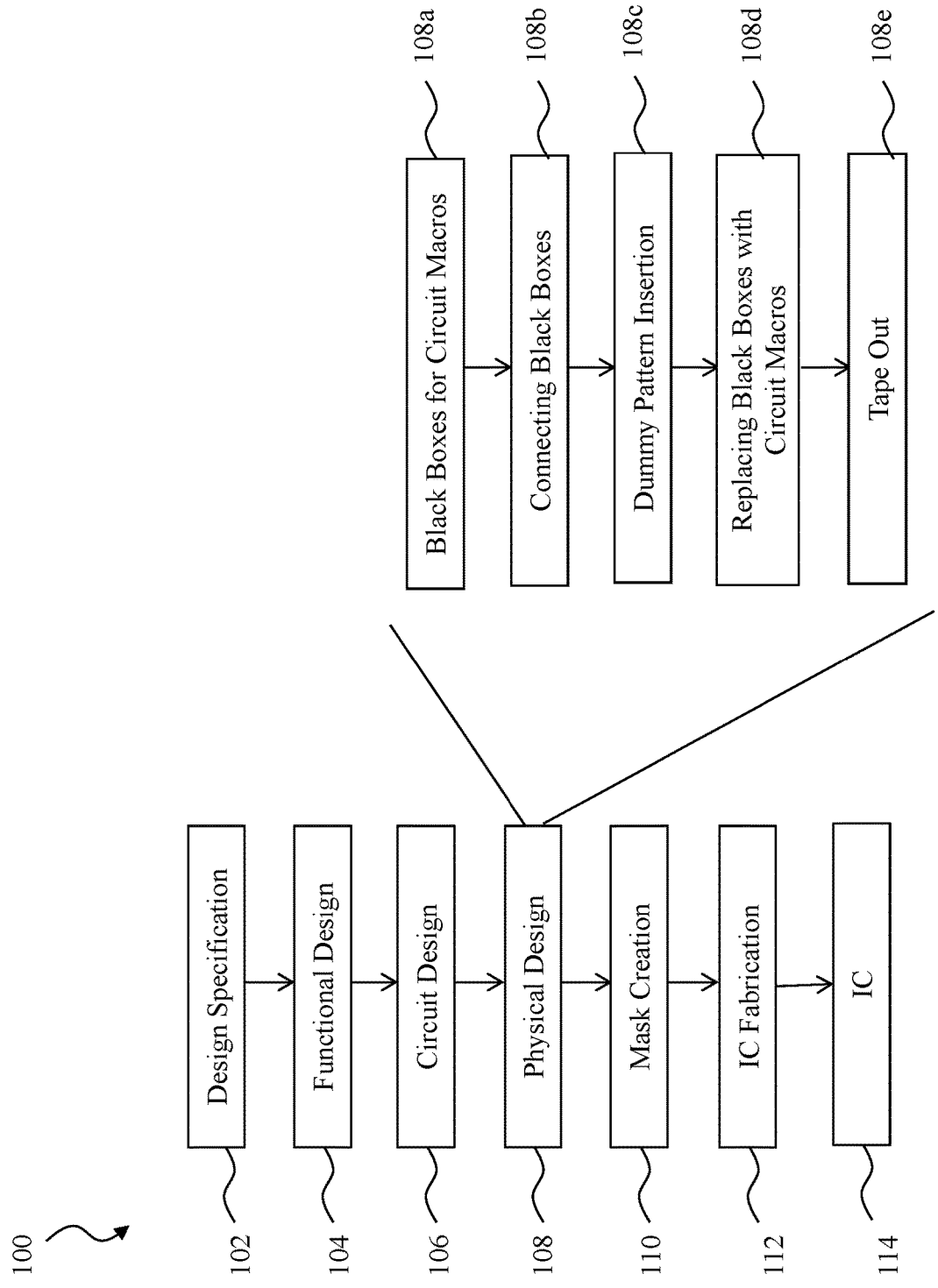
FIG. 1 is a simplified block diagram of an embodiment of an integrated circuit (IC) design and manufacturing flow according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure is generally related to methods for IC design and manufacturing, and more particularly to methods for integrating or incorporating circuit macros (sometimes referred to as IP blocks) into an IC. The circuit macros may include memory blocks (such as SRAM and DRAM), CPU, network processors, wired or wireless transmitters, wired or wireless receivers, and/or other circuits. According to an embodiment of the present disclosure, certain design tasks are performed in parallel with the circuit macros' development, thereby shortening the overall IC design cycle. For example, black boxes are placed (or inserted) into the IC layout as placeholders for the circuit macros under development. Each black box is defined based on the respective circuit macro. For example, the size and shape of each black box match the size and shape of the respective circuit macro. Also, each black box further provides pins such as inputs and/or outputs that will be provided on the respective circuit macro. After the black boxes are placed, the pins of the black boxes are connected by a connectivity network based on the IC design. Subsequently, dummy patterns are inserted into the IC layout to provide substantially uniform pattern density. After the circuit macros are developed, the black boxes are replaced by the respective circuit macros. Then, the IC layout is taped out for making photomasks. By using the black boxes, certain design tasks such as connecting the circuit macros and inserting dummy patterns are performed before the circuit macros are ready for integration, thus reducing the overall IC design cycle. Those of ordinary skill in the art should appreciate that they may readily use the present disclosure as a basis for designing or modifying other processes and/or structures for carrying out the same purposes and/or achieving the same advantages of the embodiments introduced herein.

FIG. 1 is a simplified block diagram of an embodiment of an IC design and manufacturing flow 100 (referred to as IC flow 100) to produce an IC 114. The IC flow 100 may benefit from aspects of the present disclosure. The IC flow 100 typically starts with a design specification 102 which includes the design requirements of the IC 114. It then proceeds to functional design 104 where the design of the IC 114 is partitioned into a plurality of functional blocks and the plurality of functional blocks interact to produce the desired functionalities.

The IC flow 100 then proceeds to circuit design 106. In an example, the circuit design 106 uses a bottom-up hierarchical approach where a plurality of cells are built with elementary circuit components such as resistors, capacitor, and transistors, then more complex functional blocks are built with the plurality of cells as components. Various components within a cell are coupled to form desired functionality for the cell. One mechanism for the coupling is through interconnect, also called routing. Various electronic design automation (EDA) tools are available to capture the design of the cells, the design of the functional blocks, and the design of the IC into a computer readable file. In an embodiment, the IC design is described in Register Transfer Level (RTL) language such as Verilog or VHDL and then is synthesized into a netlist. In another embodiment, the IC design is described graphically in schematic using the aforementioned hierarchical approach.

Then, the IC flow 100 proceeds to physical design 108 where an IC layout 200 is produced, such as the IC layout 200 shown in FIGS. 2 through 12. The IC layout 200 includes various geometrical patterns designed for the IC 114. The geometrical patterns correspond to patterns of metal, oxide, or semiconductor layers that make up the various components of the IC 114 to be fabricated. The various layers combine to form various IC features. For example, a portion of the IC layout 200 includes various IC features, such as active regions, gate electrodes, sources and drains, metal lines and vias of an interlayer interconnection, and openings for bonding pads, to be formed in or on a semiconductor substrate (such as a silicon wafer) and various material layers disposed on the semiconductor substrate. The IC layout 200 is presented in one or more data files having information of the geometrical patterns. For example, the IC layout 200 can be expressed in a GDSII file format (or DFII file format). The physical design 108 includes various operations which will be described in greater details later in this disclosure.

Then, the IC flow 100 proceeds to mask creation 110 to produce one or more masks (or photomasks) to be used for fabricating the various layers of the IC 114 according to the IC layout 200. The mask creation 110 includes various tasks such as mask data preparation, where the IC layout 200 is translated into a form that can be physically written by a mask writer, and mask fabrication, where the layout prepared by the mask data preparation is modified to comply with a particular mask writer and/or mask manufacturer and is then fabricated. The mask data preparation may include optical proximity correction (OPC) and lithography process checking (LPC). The mask data preparation can include further resolution enhancement techniques (RET), such as off-axis illumination, sub-resolution assist features, phase-shifting masks, other suitable techniques, or combinations thereof.

The mask fabrication may use various technologies. For example, a mask may be formed using binary technology. A binary mask includes a transparent substrate (e.g., fused quartz) and an opaque material (e.g., chromium) coated in the opaque regions of the mask. In another example, a mask is formed using a phase shift technology. In a phase shift mask (PSM), various features on the mask are configured to have proper phase difference to enhance the resolution and imaging quality. A phase shift mask can be attenuated PSM, alternating PSM, or other types of PSM. The mask can be transmissive (such as masks used for DUV lithography) or reflective (such as masks used for EUV lithography).

Then, the IC flow 100 proceeds to IC fabrication 112. The IC fabrication 112 may be performed by a myriad of manufacturing facilities. For example, there may be a manufacturing facility for the front-end fabrication of a plurality of IC products (i.e., front-end-of-line (FEOL) fabrication), while a second manufacturing facility may provide the back-end fabrication for the interconnection and packaging of the IC products (i.e., back-end-of-line (BEOL) fabrication), and a third manufacturing facility may provide other services for the foundry business.

In an example, a semiconductor wafer is fabricated using the mask (or masks) to form the IC 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps).

After being fabricated, the IC devices 114 typically go through packaging and testing processes before being delivered to the market. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

FIG. 1 also shows more detailed operations of the physical design 108 according to various aspects of the present disclosure. In the present embodiment, the physical design 108 includes an operation 108a for inserting or placing black boxes into the IC layout 200. These black boxes are placeholders for circuit macros that are under development. Some of the black boxes may be placed to abut each other or to overlap with each other depending on whether the corresponding circuit macros will abut each other or overlap with each other.

The physical design 108 further includes an operation 108b for connecting some of the black boxes using a connectivity network based on the design scheme of the IC 114. The operations 108a and 108b may be accomplished with the assistance of a place-and-route module in an EDA tool.

The physical design 108 further includes an operation 108c for inserting or placing dummy patterns into the IC layout 200, for example, to achieve a substantially uniform pattern density in the IC layout 200. Such uniform pattern density helps eliminate dishing or other adverse effects during the IC fabrication 112 and may provide other benefits.

The physical design 108 further includes an operation 108d for replacing the black boxes with circuit macros that have been fully developed (for example, each circuit macro has been placed, routed, functionally verified, and DRC checked). In an embodiment, the connectivity network and the dummy patterns remain unchanged during this operation.

The physical design 108 further includes an operation 108e for taping out of the IC layout 200, which includes checking the IC layout 200 for compliance with a set of design rules required by the IC manufacturer(s). By using the operations of the physical design 108, an IC designer does not have to wait for the circuit macros to be fully developed before performing certain tasks, such as those in the operations 108b (including connecting the circuit macros) and 108c (including inserting dummy patterns). Instead, these tasks are performed in parallel with the development of the circuit macros, thereby advantageously shortening the design cycle and shortening the time to market.

The physical design 108 may include other operations not shown in FIG. 1, such as extracting the resistance and capacitance and simulating the IC 114 or the IC layout 200 at various stages of the design flow.

The various operations of the physical design 108 are further discussed below in conjunction with FIGS. 2-6, which show diagrammatic views of the IC layout 200 during the various operations of the physical design 108 shown in FIG. 1 according to various aspects of the present disclosure.

FIG. 2 shows the IC layout 200 at an initial stage or an intermediate stage. Although not illustrated in FIG. 2, the IC layout 200 may include input/output (I/O) cells, standard cells, and/or circuit macros that have been fully developed. Such cells and/or macros can be placed in various locations according to the functional connectivity and the optimization of signal routing.

FIG. 3 shows the IC layout 200 after black boxes 204 are inserted or placed into the IC layout 200 (e.g., by the operation 108a), according to an embodiment of the present disclosure. The example shown in FIG. 3 includes four black boxes 204a, 204b, 204c, and 204d for illustration purposes. In various embodiments, the IC layout 200 may have any number of black boxes 204 including only one black box. These black boxes are placeholders for circuit macros that have not been fully developed and may be developed simultaneously with the IC layout 200. Incorporating circuit macros in the IC layout 200 advantageously enables parallel development of the IC 114. For example, the circuit macros may be developed by different design houses to maximize resource sharing. The shape and size of each black box 204 substantially match the shape and size of the corresponding circuit macro. In an embodiment, each black box 204 includes I/Os whose location and property (such as width, direction, and so on) match those of the I/Os on the corresponding circuit macro. In some embodiments, each black box 204 may further come with a simulation model for simulating the functionality of the corresponding circuit macro. The placement of the black boxes 204 may be automated using an EDA tool (such as the EDA tool 600 shown in FIG. 13).

Figure 4:
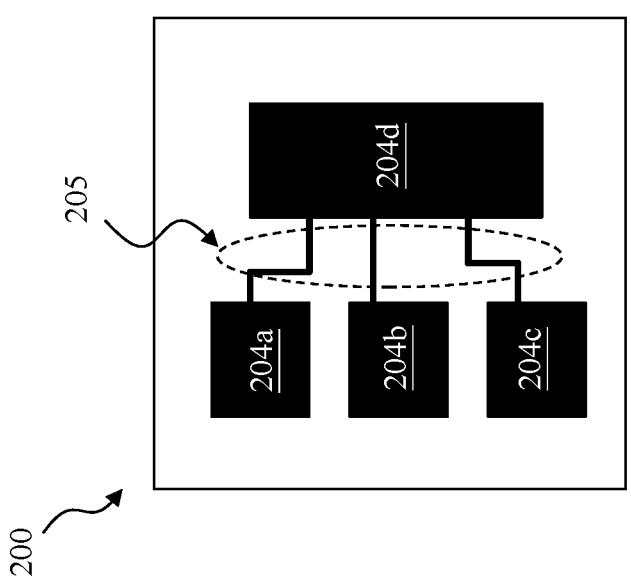

FIG. 4 shows the IC layout 200 after the black boxes 204 are connected by a connectivity network 205 (e.g., by the operation 108b), according to an embodiment of the present disclosure. In an embodiment, the connectivity network 205 includes routings at any available layers of the IC 114. For example, the routings may be implemented at transistor source/drains, gates, contacts, vias, and/or metal interconnects. The creation of the connectivity network 205 may be automated using an EDA tool (such as the EDA tool 600 shown in FIG. 13). The example in FIG. 4 shows that the connectivity network 205 connects each of the black boxes 204a, 204b, and 204c to the black box 204d. In various embodiments, the connectivity network 205 may connect any of the black boxes 204.

Figure 5:
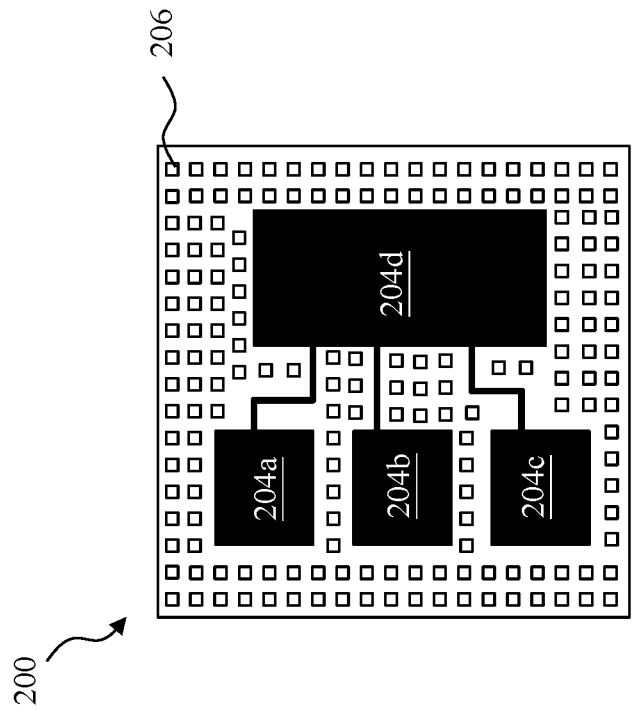

FIG. 5 shows the IC layout 200 after the dummy patterns 206 are inserted or placed into the IC layout 200 (e.g., by the operation 108c), according to an embodiment of the present disclosure. The dummy patterns 206 provide a substantially uniform pattern density in the areas of the IC layout 200 that are not occupied by the black boxes 204 and the connectivity network 205. The substantially uniform pattern density helps improve the quality of manufacturing. For example, the dummy patterns 206 help reduce or eliminate dishing effects or other adverse effects during chemical mechanical planarization (CMP) or other manufacturing processes. The dummy patterns 206 may have any shape or size that are permitted by the IC manufacturer. In some embodiments, the IC manufacturer supplies a design library with various dummy patterns 206 for an IC designer to choose. The design library may contain other patterns or cells that are functional patterns, i.e., not dummy patterns.

The dummy patterns 206 may be inserted at various layers of the IC 114. For example, the dummy patterns 206 may be inserted at the active region level (e.g., source/drain), gate level, contact level, and interconnect levels. The shape and size of the dummy patterns 206, the spacing among the dummy patterns 206, the spacing between the dummy patterns 206 and the black boxes 204, and the spacing between the dummy patterns 206 and the connectivity network 205 conform to design rules of the IC manufacturer. The insertion of the dummy patterns 206 may be automated using an EDA tool (such as the EDA tool 600 shown in FIG. 13). After the dummy patterns 206 are inserted, the operation 108c may perform a design rule checking (DRC) to ensure that the IC layout 200 including the black boxes 204, the connectivity network, and the dummy patterns 206 satisfy the design rules.

Figure 6:
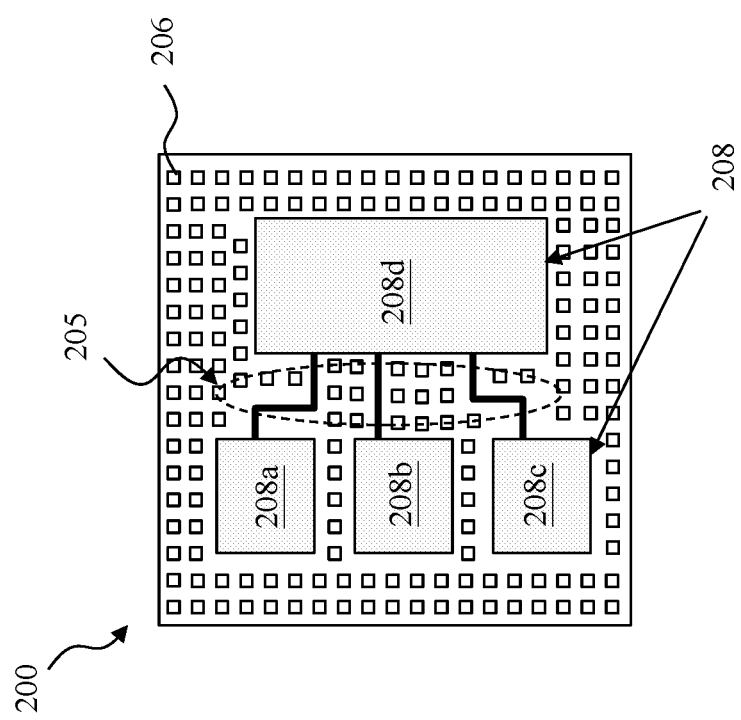

FIG. 6 shows the IC layout 200 after the black boxes 204 are replaced by circuit macros 208 (e.g., by the operation 108d), according to an embodiment of the present disclosure. In an embodiment, the circuit macros 208 have been fully developed. For example, the circuit macros 208 have been placed-and-routed, have passed functional and timing verifications, and have passed DRC. In an embodiment, all the black boxes 204 are replaced with their corresponding circuit macros 208 at the same time. Alternatively, the black boxes 204 may be replaced as their corresponding circuit macros 208 become available. Because the black boxes 204 have reserved the space in the IC layout 200 for the circuit macros 208, replacing the black boxes 204 with the circuit macros 208 can be relatively easy to accomplish. Further, the connectivity network 205 remains unchanged at this operation, which further shortens the development cycle. Replacing the black boxes 204 with the corresponding circuit macros 208 may be automated using an EDA tool (such as the EDA tool 600 shown in FIG. 13).

After the black boxes 204 are replaced with circuit macros 208, the physical design 108 may perform further tasks before taping out of the IC layout 200 for mask fabrication. For example, the physical design 108 may extract resistance and capacitance (RC) of the IC 114 now that the circuit macros 208, the connectivity network 205, and the dummy patterns 206 are all in place. The physical design 108 may also run certain simulations, including functional simulation for verifying the functionality of the IC 114, timing simulation for verifying signal path timing, and physical simulation, such as SPICE simulation, for verifying output signal deformation, signal level, and time delay. The physical design 108 may perform a final DRC. After these tasks are finished, the physical design 108 tapes out (or tapeout) the IC layout 200 for mask fabrication. For example, the physical design 108 may output the IC layout 200 in one or more data files and transmit the one or more data files to semiconductor foundry or mask manufacturer for mask creation 110.

Figure 7:
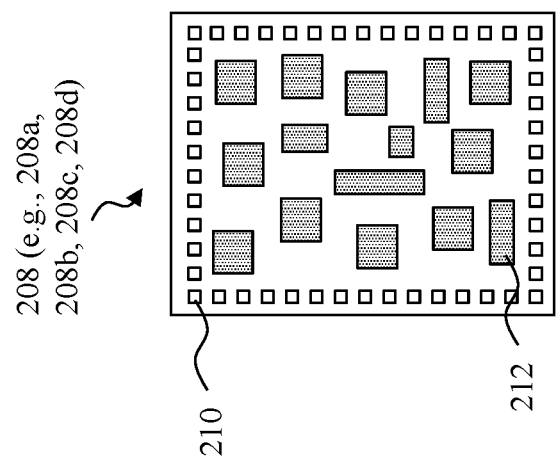

FIG. 7 shows an example layout of a circuit macro 208, according to an embodiment of the present disclosure. The circuit macro 208 represents any of the circuit macros 208a, 208b, 208c, and 208d or other circuit macros. The circuit macro 208 includes main patterns 212 in a central area of the circuit macro 208 and dummy patterns 210 along the edges of the circuit macro 208 and surrounding the main patterns 212. The circuit macro 208 may include other features not shown in FIG. 7, such as IO pins (or pads) or other dummy patterns in the central area of the circuit macro 208. The main patterns 212 perform circuit functions, while the dummy patterns 210 help provide uniform pattern density within the circuit macro 208. In an embodiment, the dummy patterns 210 and the main patterns 212 collectively provide a substantially uniform pattern density within the circuit macro 208. In another embodiment, the dummy patterns 210, the main patterns 212, and other dummy patterns in the central area of the circuit macro 208 collectively provide a substantially uniform pattern density within the circuit macro 208.

The example circuit macro 208 shown in FIG. 7 has a rectangular shape. In various embodiments, the circuit macro 208 may be of square, polygon, or other shapes. To further these embodiments, the dummy patterns 210 are distributed along all edges of the circuit macro 208 and surround the main patterns 212.

In addition to providing uniform pattern density within the circuit macro 208, the dummy patterns 210 also shield the main patterns 212 from the effects of the dummy patterns 206 once the circuit macro 208 replaces the black box 204. This way, the function and the timing (e.g., resistance and capacitance) of the circuit macro 208 remains intact after it replaces the black box 204. For the same reason, the placement of the dummy patterns 206 also remains intact after the circuit macro 208 replaces the black box 204. In other words, by using the dummy patterns 210 to shield the main patterns 212, replacing the black boxes 204 with the circuit macros 208 does not change either the circuit macros 208 or the dummy patterns 206. Thus, the IC layout 200 can be more easily verified and finalized after the circuit macros 208 replace the black boxes 204, further shortening the IC design cycle.

Figure 8:
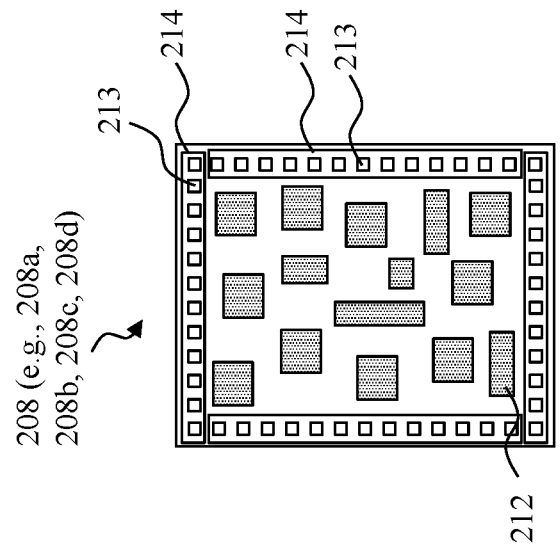
FIGS. 7 and 8 each illustrate a diagrammatic view of a circuit macro designed according to various aspects of the present disclosure.

FIG. 8 shows another example layout of a circuit macro 208, according to an embodiment of the present disclosure. The circuit macro 208 in this embodiment is similar to the one depicted in FIG. 7. However, instead of having discrete dummy patterns 210, the circuit macro 208 in this embodiment includes one dummy pattern 214 per edge. In other words, the dummy patterns 214 each extend fully along one edge of the circuit macro 208 and surround the main patterns 212. In an embodiment, each dummy pattern 214 includes many sub (or smaller) dummy patterns 213, but from an IC designer's point of view, the dummy pattern 214 is treated as one pattern during the design process. For example, it is placed into the circuit macro 208 as one unit.

In an embodiment, the dummy patterns 214 and the main patterns 212 collectively provide a substantially uniform pattern density within the circuit macro 208. In another embodiment, the dummy patterns 214, the main patterns 212, and other dummy patterns in the central area of the circuit macro 208 collectively provide a substantially uniform pattern density within the circuit macro 208. Similar to the dummy patterns 210, the dummy patterns 214 also shield the main patterns 212 from the effects of the dummy patterns 206 once the circuit macro 208 replaces the black box 204.

Figure 10:
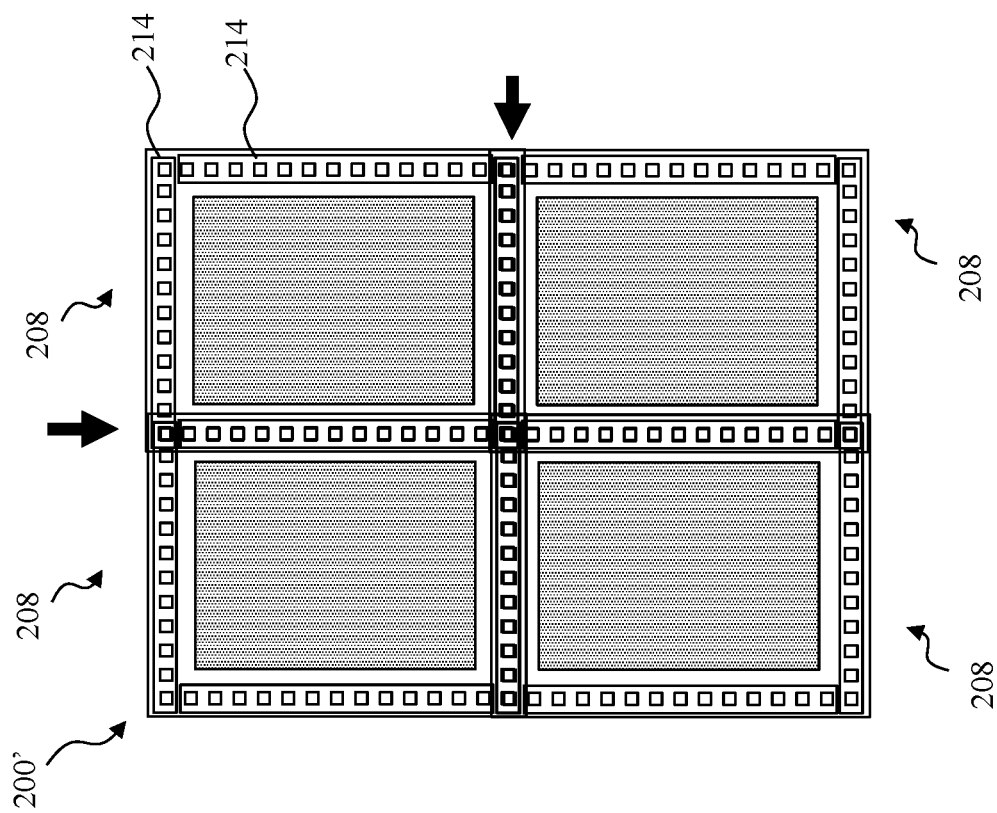
FIGS. 9 and 10 each illustrate a diagrammatic view of an IC layout with four circuit macros placed according to various aspects of the present disclosure.
Figure 9:
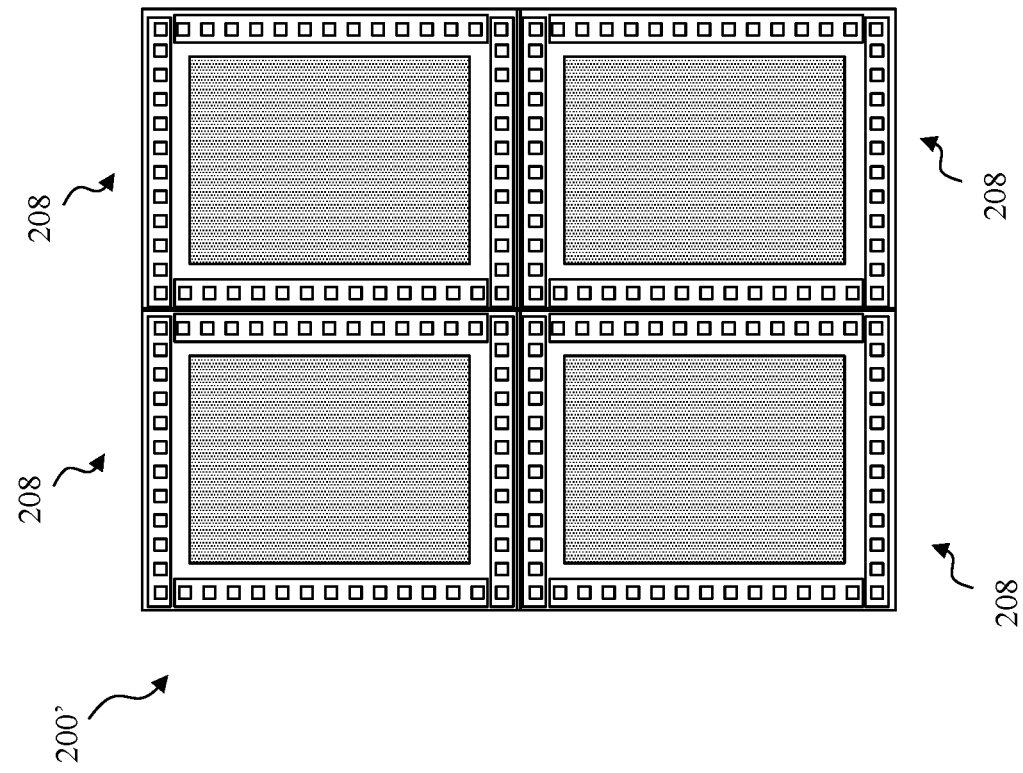

Since the dummy pattern 214 is treated as one pattern during the design process, it facilitates other design optimizations, such as shown in FIG. 9 and FIG. 10. FIG. 9 shows an example IC layout 200' with four circuit macros 208 abutting each other at their edges, according to an embodiment of the present disclosure. Each circuit macro 208 includes dummy patterns 210 or 214 along its edges. By placing the circuit macros 208 abutting each other, the area of the IC layout 200' is reduced, compared to an approach having gaps between adjacent circuit macros 208. In an embodiment, the four circuit macros 208 all include dummy patterns 214 along their respective edges. In such embodiment, the area of the IC layout 200' can be further reduced by overlapping the peripheral areas of adjacent circuit macros 208, such as shown in FIG. 10. In the embodiment shown in FIG. 10, the peripheral areas of the circuit macros 208 overlap, as indicated with the broad arrows. Effectively, two adjacent circuit macros 208 share a single dummy pattern 214, thereby further reducing the area of the IC layout 200'.

In an embodiment, an EDA tool (such as the one shown in FIG. 13) provides a function (or an operation) to IC designers that lets the IC designers choose whether to abut the circuit macros 208 or to overlap the circuit macros 208. Then, the EDA tool automatically places the circuit macros 208 in an abutting manner (such as shown in FIG. 9) or an overlapping manner (such as shown in FIG. 10). Having a single dummy pattern 214 along each edge of the circuit macro 208 simplifies the overlapping operation.

FIG. 11 shows an embodiment of the IC layout 200 where two circuit macros 208b and 208c abutting each other at their edges. This is a variant of the embodiment shown in FIGS. 2-6. To implement this embodiment, the black boxes 204b and 204c are placed abutting each other during the operation 108a. The dummy patterns in the circuit macros 208b and 208c may be in the form of dummy patterns 210 such as shown in FIG. 7 or in the form of dummy patterns 214 such as shown in FIG. 8.

FIG. 12 shows an embodiment of the IC layout 200 where two circuit macros 208b and 208c overlapping each other at their edges. This is a variant of the embodiment shown in FIGS. 2-6. To implement this embodiment, the black boxes 204b and 204c are placed overlapping each other during the operation 108a. The dummy patterns in the circuit macros 208b and 208c may be in the form of dummy patterns 214 such as shown in FIG. 8.

In each of the embodiments described above, the dummy patterns (such as dummy patterns 206, 210, 213, and 214) and the main patterns 212 conform to the design rules with respect to shapes, dimensions, spacing, or other characteristics.

Figure 13:
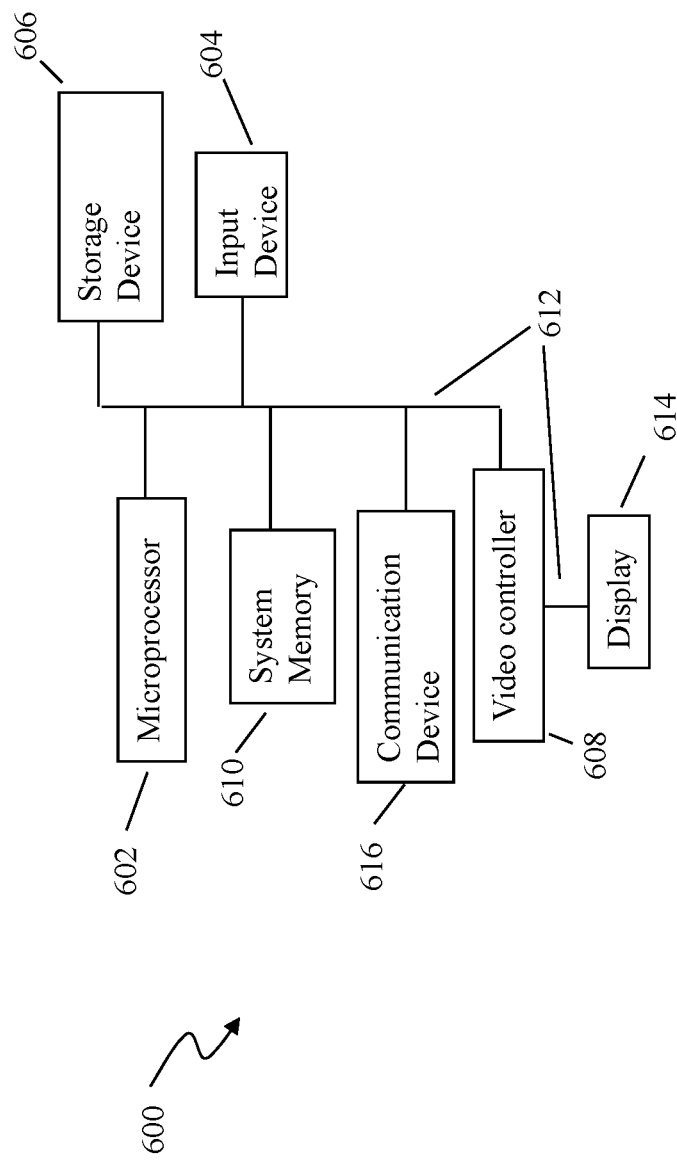
FIG. 13 illustrates a computer system or an electronic design automation (EDA) tool for implementing one or more embodiments of the present disclosure.

Referring now to FIG. 13, shown therein is an illustrative EDA tool (or IC design system or computer system) 600 for implementing embodiments of the operations described above. For example, at least one of the operations 108a, 108b, 108c, 108d, and 108e is performed by the EDA tool 600. Further, one or more operations 102, 104, and 106 may be performed by the EDA tool 600.

The EDA tool 600 includes a microprocessor 602, an input device 604, a storage device 606, a video controller 608, a system memory 610, a display 614, and a communication device 616 all interconnected by one or more buses 612.

The microprocessor 602 represents one or more general-purpose processing devices such as a microprocessor, central processing unit, or the like. More particularly, the microprocessor 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The microprocessor 602 may also be one or more special-purpose processing devices such as an application specific integrated circuit (ASIC), a field programmable gate array (FPGA), a digital signal processor (DSP), network processor, or the like. The microprocessor 602 is configured to execute instructions for performing the operations and steps discussed herein.

The storage device 606 is a non-transitory computer-readable storage media which comprises all computer-readable storage media except for a transitory, propagating signal. Some common forms of computer-readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer is adapted to read. For example, the storage device 606 may be a floppy disk, a magnetic hard disk drive (HDD), a solid-state drive (SSD), or an optical memory (e.g., CD-ROM, DVD, and Blu-Ray Disc). In addition, the storage device 606 may be capable of receiving a floppy disk, CD-ROM, DVD-ROM, or any other form of computer-readable medium that may contain computer-executable instructions.

Further, communication device 616 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, tablets, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

The system may be designed to work on any specific architecture. For example, the system may be executed on a single computer, local area networks, client-server networks, wide area networks, internets, hand-held and other portable and wireless devices and networks.

Although not intended to be limiting, one or more embodiments of the present disclosure provide many benefits to IC design and manufacturing. For example, embodiments of the present disclosure provide a method for integrating circuit macro(s) into an IC with shortened time-to-market. The method uses black boxes as placeholders for circuit macros under development and performs certain design tasks (such as dummy pattern insertion) in parallel with the development of the circuit macros. The circuit macros are designed with dummy patterns surrounding main patterns, allowing easy drop-in replacement of the black boxes. By using the disclosed method, IC design cycle can be shortened.

In one exemplary aspect, the present disclosure is directed to a method for making an integrated circuit (IC). The method includes inserting black boxes into a layout of the IC; connecting the black boxes with a connectivity network; and inserting first dummy patterns in areas of the layout outside of the black boxes and the connectivity network. After the inserting of the first dummy patterns, the method further includes replacing the black boxes with circuit macros that have one-to-one correspondence with the black boxes, wherein each of the circuit macros includes circuit patterns in a central area of the respective circuit macro and second dummy patterns surrounding the central area. In the method, at least one of the following operations is performed by an electronic design automation (EDA) tool: the inserting of the black boxes, the connecting of the black boxes, the inserting of the first dummy patterns, and the replacing of the black boxes with the circuit macros.

In an embodiment, after the replacing of the black boxes with the circuit macros, the method further includes taping out the layout with the first dummy patterns and the circuit macros for making photomasks. In a further embodiment, the method includes making photomasks using the layout with the first dummy patterns and the circuit macros. In a further embodiment, the method includes manufacturing wafers using the photomasks.

In an embodiment of the method, one of the circuit macros includes multiple second dummy patterns each extending fully along an edge of the one of the circuit macros. In a further embodiment, each of the multiple second dummy patterns of the one of the circuit macros includes sub dummy patterns.

In another embodiment of the method, each of the black boxes and the circuit macros has a substantially rectangular shape. In an embodiment, the first dummy patterns provide a substantially uniform pattern density in the areas of the layout outside of the black boxes and the connectivity network, and the circuit patterns and the second dummy patterns collectively provide a substantially uniform pattern density inside each circuit macro.

In an embodiment of the method, two of the black boxes are placed abutting each other, and the two respective circuit macros are placed abutting each other. In another embodiment, two of the black boxes are placed partially overlapping with each other, and the two respective circuit macros are placed partially overlapping with each other.

In another exemplary aspect, the present disclosure is directed to a method for making an integrated circuit (IC). The method includes placing black boxes into a layout of the IC, wherein the black boxes include pins; connecting the pins of the black boxes with a connectivity network; and inserting first dummy patterns in areas of the layout outside of the black boxes and the connectivity network, wherein the first dummy patterns provide a substantially uniform pattern density in the areas of the layout outside of the black boxes and the connectivity network. After the inserting of the first dummy patterns, the method further includes replacing the black boxes with circuit macros that have one-to-one correspondence with the black boxes, wherein each of the circuit macros includes circuit patterns in a central area of the respective circuit macro and second dummy patterns surrounding the central area, wherein the circuit patterns and the second dummy patterns collectively provide a substantially uniform pattern density inside the respective circuit macro. The method further includes taping out the layout with the first dummy patterns and the circuit macros for making photomasks. In the method, at least one of the following operations is performed by an electronic design automation (EDA) tool: the placing of the black boxes, the connecting of the pins of the black boxes, the inserting of the first dummy patterns, the replacing of the black boxes with the circuit macros, and the taping out of the layout.

In an embodiment of the method, two of the black boxes are placed abutting each other, and the two respective circuit macros are placed abutting each other. In another embodiment, two of the black boxes are placed partially overlapping with each other, and the two respective circuit macros are placed partially overlapping with each other. In a further embodiment, the two respective circuit macros share a column of the second dummy patterns.

In an embodiment, the method further includes making photomasks using the layout with the first dummy patterns and the circuit macros. In another embodiment, the method further includes manufacturing wafers that correspond to the layout with the first dummy patterns and the circuit macros.

In yet another exemplary aspect, the present disclosure is directed to an integrated circuit (IC) design system. The IC design system includes a non-transitory memory and one or more hardware processors coupled to the non-transitory memory. The one or more hardware processors are configured to execute instructions to perform operations including placing black boxes into a layout of an IC; connecting the black boxes with a connectivity network; and inserting first dummy patterns in areas of the layout outside of the black boxes and the connectivity network, wherein the first dummy patterns provide a substantially uniform pattern density in the areas of the layout outside of the black boxes and the connectivity network. After the inserting of the first dummy patterns, the one or more hardware processors are configured to execute instructions to perform further operations including replacing the black boxes with circuit macros that have one-to-one correspondence with the black boxes, wherein each of the circuit macros includes circuit patterns in a central area of the respective circuit macro and second dummy patterns surrounding the central area; and taping out of the layout with the first dummy patterns and the circuit macros.

In an embodiment of the IC design system, for each circuit macro, the circuit patterns and the second dummy patterns collectively provide a substantially uniform pattern density inside the respective circuit macro. In another embodiment, two of the black boxes are placed partially overlapping with each other, and the two respective circuit macros are placed to share a column of the second dummy patterns. In yet another embodiment, two of the black boxes are placed to share a common edge, and the two respective circuit macros are placed to share a common edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making an integrated circuit (IC), comprising:
    inserting black boxes into a layout of the IC;
    connecting the black boxes with a connectivity network;
    inserting first dummy patterns in areas of the layout outside of the black boxes and the connectivity network; and
    after the inserting of the first dummy patterns, replacing the black boxes with circuit macros that have one-to-one correspondence with the black boxes, wherein each of the circuit macros includes circuit patterns in a central area of the respective circuit macro and second dummy patterns surrounding the central area,
    wherein at least one of the following operations is performed by an electronic design automation (EDA) tool:
    the inserting of the black boxes,
    the connecting of the black boxes,
    the inserting of the first dummy patterns, and
    the replacing of the black boxes with the circuit macros.

2. The method of claim 1, after the replacing of the black boxes with the circuit macros, further comprising:
    taping out the layout with the first dummy patterns and the circuit macros for making photomasks.

3. The method of claim 2, further comprising:
    making photomasks using the layout with the first dummy patterns and the circuit macros.

4. The method of claim 3, further comprising:
    manufacturing wafers using the photomasks.

5. The method of claim 1, wherein one of the circuit macros includes multiple second dummy patterns each extending fully along an edge of the one of the circuit macros.

6. The method of claim 5, wherein each of the multiple second dummy patterns of the one of the circuit macros includes sub dummy patterns.

7. The method of claim 1, wherein each of the black boxes and the circuit macros has a substantially rectangular shape.

8. The method of claim 1, wherein the first dummy patterns provide a substantially uniform pattern density in the areas of the layout outside of the black boxes and the connectivity network, and the circuit patterns and the second dummy patterns collectively provide a substantially uniform pattern density inside each circuit macro.

9. The method of claim 1, wherein two of the black boxes are placed abutting each other, and the two respective circuit macros are placed abutting each other.

10. The method of claim 1, wherein two of the black boxes are placed partially overlapping with each other, and the two respective circuit macros are placed partially overlapping with each other.

11. A method for making an integrated circuit (IC), comprising:
    placing black boxes into a layout of the IC, wherein the black boxes include pins;
    connecting the pins of the black boxes with a connectivity network;
    inserting first dummy patterns in areas of the layout outside of the black boxes and the connectivity network, wherein the first dummy patterns provide a substantially uniform pattern density in the areas of the layout outside of the black boxes and the connectivity network;

after the inserting of the first dummy patterns, replacing the black boxes with circuit macros that have one-to-one correspondence with the black boxes, wherein each of the circuit macros includes circuit patterns in a central area of the respective circuit macro and second dummy patterns surrounding the central area, wherein the circuit patterns and the second dummy patterns collectively provide a substantially uniform pattern density inside the respective circuit macro; and taping out the layout with the first dummy patterns and the circuit macros for making photomasks, wherein at least one of the following operations is performed by an electronic design automation (EDA) tool:
the placing of the black boxes,
the connecting of the pins of the black boxes,
the inserting of the first dummy patterns,
the replacing of the black boxes with the circuit macros, and
the taping out of the layout.

12. The method of claim 11, wherein two of the black boxes are placed abutting each other, and the two respective circuit macros are placed abutting each other.

13. The method of claim 11, wherein two of the black boxes are placed partially overlapping with each other, and the two respective circuit macros are placed partially overlapping with each other.

14. The method of claim 13, wherein the two respective circuit macros share a column of the second dummy patterns.

15. The method of claim 11, further comprising:
making photomasks using the layout with the first dummy patterns and the circuit macros.

16. The method of claim 11, further comprising:
manufacturing wafers that correspond to the layout with the first dummy patterns and the circuit macros.

17. An integrated circuit (IC) design system, comprising:
a non-transitory memory; and
one or more hardware processors coupled to the non-transitory memory, the one or more hardware processors to execute instructions to perform operations comprising:
placing black boxes into a layout of an IC;
connecting the black boxes with a connectivity network;
inserting first dummy patterns in areas of the layout outside of the black boxes and the connectivity network, wherein the first dummy patterns provide a substantially uniform pattern density in the areas of the layout outside of the black boxes and the connectivity network;
after the inserting of the first dummy patterns, replacing the black boxes with circuit macros that have one-to-one correspondence with the black boxes, wherein each of the circuit macros includes circuit patterns in a central area of the respective circuit macro and second dummy patterns surrounding the central area; and
taping out of the layout with the first dummy patterns and the circuit macros.

18. The IC design system of claim 17, wherein, for each circuit macro, the circuit patterns and the second dummy patterns collectively provide a substantially uniform pattern density inside the respective circuit macro.

19. The IC design system of claim 17, wherein two of the black boxes are placed partially overlapping with each other, and the two respective circuit macros are placed to share a column of the second dummy patterns.

20. The IC design system of claim 17, wherein two of the black boxes are placed to share a common edge, and the two respective circuit macros are placed to share a common edge.

* * * * *